United States Patent [19]

Ii

[11] Patent Number: 5,111,151

[45] Date of Patent: May 5, 1992

[54] DIGITAL PHASE LOCKED LOOP SYSTEM

[75] Inventor: Hiroshi Ii, Higashi-Hiroshima, Japan

[73] Assignee: Sharp Kabushiki Kaisha, Osaka, Japan

[21] Appl. No.: 424,697

[22] Filed: Oct. 20, 1989

[30] Foreign Application Priority Data

Oct. 21, 1988 [JP] Japan .................. 63-266676

[51] Int. Cl.⁵ .................. H03K 5/13; H03L 7/00; H03D 3/24
[52] U.S. Cl. .................. 328/155; 307/262; 331/1 A; 375/120
[58] Field of Search ............... 328/155, 141; 307/271, 307/262; 375/111, 118, 120; 331/1 A

[56] References Cited

U.S. PATENT DOCUMENTS

| | | | |
|---|---|---|---|
| 3,983,498 | 9/1976 | Malek | 328/134 |
| 4,280,099 | 7/1981 | Rattlingourd | 328/155 |
| 4,677,394 | 1/1987 | Vollmer | 331/1 A |
| 4,893,087 | 1/1990 | Davis | 328/155 |
| 4,896,337 | 1/1990 | Bushy, Jr. | 328/155 |
| 4,918,403 | 4/1990 | Martin | 331/1 A |
| 4,922,548 | 5/1990 | Cowley | 331/1 A |

Primary Examiner—Timothy P. Callahan

[57] ABSTRACT

A digital phase locked loop system uses a clock signal from an oscillator which is frequency-divided by a frequency divider, thereby causing a phase locked loop clock signal locked to the input signal being produced. At this time, the phase difference between the input signal and the phase locked loop clock signal is computed by a counter. Then, by setting a frequency dividing ratio on the basis of the computed figure, the phase locked loop clock signal from the frequency divider is locked to the input signal. Furthermore, to correspond to fluctuation when the input signal is digitally pulse-width modulated, the pulse width of the input signal is computed by counter on the basis of the clock pulse. The computed figures are converted to the values which match the minimum repeatable frequency of the input signal. After the frequency dividing ration correspolnding to the phase difference is set for the frequency divider, such a frequency dividing ratio can coincide the phase of the input signal and the phase of the phase locked loop clock signal in accordance with the converted figures corresponding to the frequency of the input signal. Namely, such a digital phase locked loop system as described above can be of a simplified construction and can produce the phase locked loop clock signal locked to the input signal with good characteristics, even with a wide range of fluctuations in the input signal.

7 Claims, 10 Drawing Sheets

FIG. 1
PRIOR ART

FIG. 3(1) (PRIOR ART) MCK
FIG. 3(2) (PRIOR ART) PBSG
FIG. 3(3) (PRIOR ART) PLLCK
FIG. 3(4) (PRIOR ART) $\overline{Q}A$
FIG. 3(5) (PRIOR ART) CNTOUT
FIG. 3(6) (PRIOR ART) RESET
FIG. 3(7) (PRIOR ART) I
FIG. 3(8) (PRIOR ART) E
FIG. 3(9) (PRIOR ART) F
FIG. 3(10) (PRIOR ART) G
FIG. 3(11) (PRIOR ART) H

DIGITAL PHASE LOCKED LOOP SYSTEM

BACKGROUND OF THE INVENTION

1. Field of the Invention

The present invention relates to a digital phase locked loop system in which a phase locked loop is composed of digital circuit elements.

2. Description of the Prior Art

Various kinds of digital phase locked loop system have been developed recently. The digital phase locked loop system is a phase locked which loop is composed of digital circuit elements. In comparison with an analog system, imbalance due to components hardly used occurs, and there is an advantage to obtain the desired characteristics without any adjustment. On the contrary, in a digital phase locked loop system, generally the output of an oscillator is frequency-divided, and loop output can be obtained. Therefore, it is possible for a phase locked loop to be operated only with an input frequency, which is less one several decades of the maximum operation frequency of a logic circuit element to be used therefor.

In the case when the input frequency is higher than the clock frequency of a fixed oscillator, the ratio of frequency division must be made small, thereby causing the quantization to be rough and the loop characteristics to be bad. Especially, in a digital phase locked loop system for the input frequency which is several decades less than the maximum operation frequency in the logic circuit elements, it is difficult to adopt a complicated composition of circuits since influence due to the characteristics of logic circuit elements themselves, especially the delay characteristics, is large together with influences by errors in the quantization.

Figure 1:
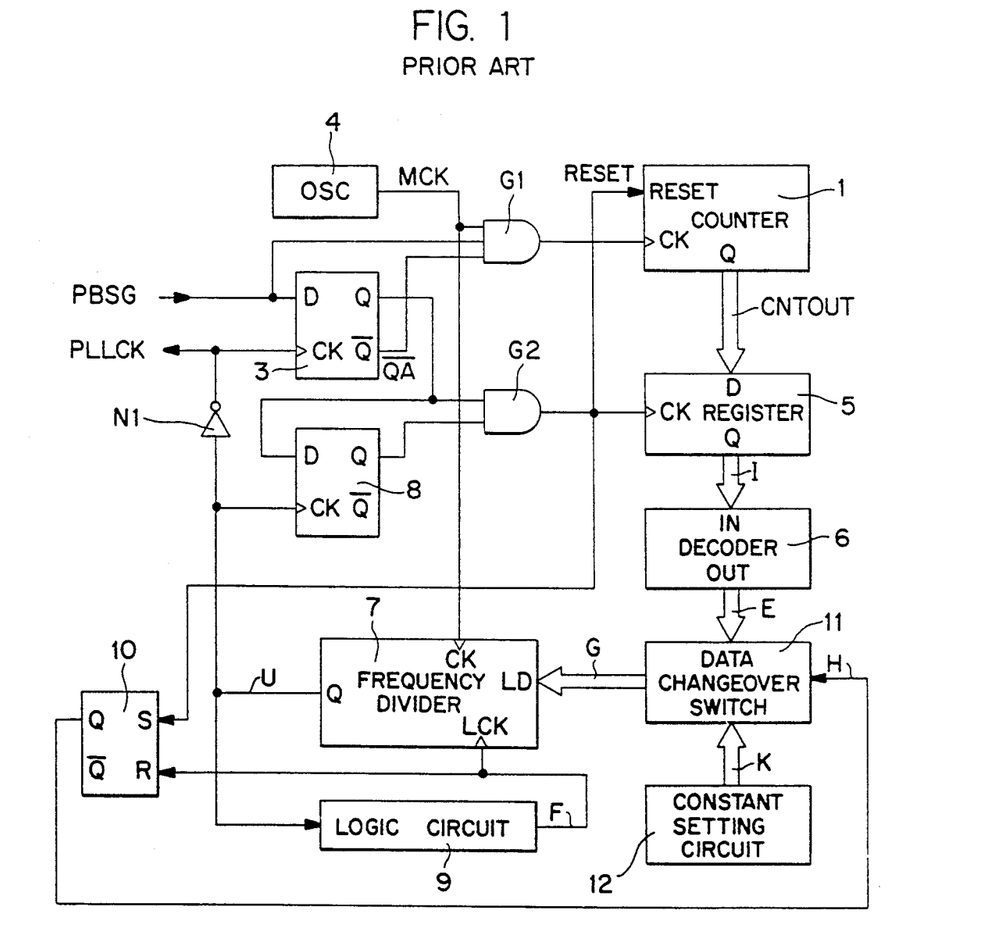
FIG. 1 is a block diagram showing an electrical construction of a digital phase locked loop system in the prior art.

FIG. 1 shows one of the examples of a conventional phase locked loop system for input which is several decades (that is, 1/N when N is a positive integral number less than the frequency of an oscillator (OSC) 4.

The predetermined frequency which is generated by the oscillator 4, a clock pulse MCK, for example 75 MHz is frequency-divided at the ratio of frequency division predetermined by a frequency divider 7, and the output U is led out as phase locked loop clock signal PLLCK by a reversing circuit N1. The phase difference between the input signal PBSG and a phase locked loop clock signal PLLCK is detected as a computed value of the counter 1.

Clock pulse MCK which is the output of the oscillator 4 is shown in FIG. 2(1), the input signal PBSG is shown in FIG. 2(2), the phase locked loop clock signal PLLCK is shown in FIG. 2(3), and a signal $\overline{QA}$ which comes from the output terminal $\overline{Q}$ of a D-type flip-flop (DFF) 3 is shown in FIG. 2(4).

Clock pulse MCK, input signal PBSG and output signal $\overline{QA}$ of D-type flip-flop 3 are inputted into an AND gate G1. The output of the AND gate G1 is inputted into the clock input terminal CK of counter 1. The output signal CNTOUT of counter 1 is shown in FIG. 2(5).

The output signal U of frequency divider 7 inputted into the clock input terminal CK of the D-type flip-flop 8 and is simultaneously inputted to the clock input terminal CK of the D-type flip-flop 3 by a reversing circuit N1. Furthermore, the reversed output signal $\overline{U}$ is led out as phase locked loop clock signal PLLCK.

The output of AND gate G2 is inputted into the counter 1 and the register 5 as a reset signal RESET and is simultaneously inputted into the set terminal S of RS-type flip-flop 10. The reset signal RESET is shown in FIG. 2(6). In FIG. 2, a phase difference corresponding to the time from the UP timing (a) of the input signal PBSG to the UP timing (b) of the phase locked loop clock signal PLLCK occurs, and this timing can be measured by the counter 1 on the basis of the clock pulse MCK.

Namely, as the input signal PBSG, the output signal $\overline{QA}$ of the D-type flip-flop 3, in which the input signal PBSG are latched at the UP timing of the phase lock loop clock signal PLLCK, and the clock pulse MCK of the fixed oscillator 4 are inputted into the AND gate G1, the counter 1 into which the output of the AND gate G1 is inputted can calculate the timing (a) to (b). The counter 1 counts the pulse from the AND gate G1 until the reset signal RESET is inputted from another AND gate G2.

Both the output from the output terminal Q of D-type flip-flop 3 and the output from the output terminal $\overline{Q}$ of another D-type flip-flop 8 by which the former output is furthermore latched at the UP timing of the output signal U of the frequency divider 7 are inputted into the AND gate G2. At the UP timing of the reset signal RESET from the AND gate G2, the signal CNTOUT expressing the computed value of the counter 1 is latched by the register 5, and at the same time the counter 1 is reset in response to the reset signal RESET and is set at the start of the next input signal PBSG. Thus the next computing action is started.

A phase difference signal I outputted from the register 5 is shown in FIG. 2(7), and this signal I is inputted into the decoder 6 where it is decoded into signal E to express the corresponding ratio of frequency division. The signal E outputted from the decoder 6 is shown in FIG. 2(8) and is loaded into a frequency divider 7 as load signal G to express the ratio of frequency division by a data changeover switch 11.

Thus, according to the phase difference signal I between the input signal PBSG and the phase lock loop clock signal PLLCK, the clock pulse MCK of the oscillator 4 is frequency-divided to change the ratio of frequency division of a frequency divider 7 which emits the phase locked loop clock signal PLLCK, thereby causing the phases to coincide between the input signal PBSG and the phase locked loop clock signal PLLCK.

That is, the frequency divider 7 operates at the ratio "N" of frequency division when the phase of the input signal PBSG is coincident with the phase of the phase locked loop clock signal PLLCK, and the ratio of frequency division is set to such as N+1 or N−1 according to the degree of the phase difference, thereby causing the phases to be made coincident with each other.

The load signal G to express the ratio of frequency division, which is outputted from the data changeover switch 11 to the frequency divider 7 is loaded into the frequency divider 7 in response to the load clock signal F. This load clock signal F is emitted by the logic circuit 9 as shown in FIG. 2(9) when the output signal U of the frequency divider 7 becomes a specified value. The specified value N is 8 in FIG. 2, and the load signal G whose ratio of frequency division is [9] according to a data changeover switch 11 is outputted from the decoder 6 at the timing (c) since phase difference occurs between the timing (a) and (b), and the phase difference of the phase locked loop clock signal PLLCK is compensated to be zero at the timing (g).

Also, the load clock signal F is inputted to the frequency divider 7 and is simultaneously inputted into the reset terminal R of the RS-type flip-flop 10. Therefore, the RS-type flip-flop 10 is set by the output of the AND gate G2 and is reset by the load signal F from the logic circuit 9. The signal H from the output terminal Q of this RS-type flip-flop 10 is shown in FIG. 2(11) and is inputted into the data changeover switch 11.

The data changeover switch 11 inputs the output E which comes from the decoder 6, to the frequency divider 7 as load signal G when the signal H is a HIGH level and inputs a signal K to express a constant N, which has been defined in advance from a constant setting circuit 12, to the frequency divider 7 as load signal G when the signal H is a LOW level. For instance, in this example, the constant N is [8]. The load signal G to express the ratio of frequency division inputted into the frequency divider 7 from the data changeover switch 11 is shown in FIG. 2(10).

The phase difference between the UP timing (a) of the input signal PBSG and the UP timing (b) of the phase locked loop clock signal PLLCK is computed by inputting the clock pulse MCK from the oscillator 4 by way of the AND gate G1 in the counter 1. Then, the output signal CNTOUT is given to the register 5.

In the case when the output from an output terminal Q of the D-type flip-flop 3 is a HIGH level, i.e., the UP waveform of the output signal U of a frequency divider 7 is inputted in the D-type flip-flop 8, the UP waveform of the reset signal RESET can be obtained from the AND gate G2, thereby causing the output [3] of counter 1 to be stored in the register 5 and the phase difference signal I of the register 5 to be given to the decoder 6. Then the output E to express the previously corresponding ratio [9] of frequency division is outputted from the decoder 6.

The RS-type flip-flop 10 outputs the signal H of a HIGH level, in response to the reset signal RESET from the AND gate G2. Therefore, the data changeover switch 11 is changed over so that the output E from the decoder 6 can be inputted into the frequency divider 7 as load signal G, and according to the load clock signal F from the logic circuit 9 the load signal G, the output E is loaded into the frequency divider 7 at the timing (c) shown in FIG. 2(9). Thus, the frequency divider 7 operates at the ratio [9] of frequency division.

Also, the load clock signal F from the logic circuit 9 resets the RS-type flip-flop 10 at the DOWN timing (c), and the signal H from the output terminal Q is caused to be a LOW level. Thereby, the data changeover switch 11 outputs the signal K to express a constant N from the constant setting circuit 12 to the frequency divider 7 as load signal G. Therefore, even at the timing (d) and (e) when the load clock signal F of the logic circuit 9 is outputted after the timing (c), the signal K from the constant setting circuit 12 is loaded in the frequency divider 7, thereby causing the frequency dividing operation to be conducted at the frequency dividing ratio N=8.

Thus, after the reset signal RESET is outputted from the AND gate G2, the ratio [9] of frequency division to compensate a phase difference signal I to express the phase difference from the register 5 is loaded into the frequency divider 7 in the time up to the timing (c). Thereafter, the predetermined frequency dividing ratio N (=8) is loaded when the phase difference of signals PBSG and PLLCK is the per expected value [8], thereby the phase difference between the UP timing (f) of input signal PBSG and the UP timing (g) of phase locked loop clock signal PLLCK can become as small as possible.

In a phase locked loop system shown in FIG. 1, in order to prevent the phase lock loop signal PLICK from being compensated based upon the length of a pulse width when the pulse width of input signal PBSG has a digitally converted waveform and bad influence from affecting the characteristics of phase lock loop, the ratio of frequency division is compensated one or more defined number of times. Thereafter, the predetermined constant N is used as ratio of frequency division.

In the digital phase locked loop system shown in FIG. 1 as above mentioned, operation can be carried out at a response speed which is nearly equivalent to the limit of logic circuit elements. Thus even a simple composition can result in good characteristics.

However, in such a composition as shown in FIG. 1, the characteristics will become bad when the frequency of input signal PBSG is totally changed. For example, when the time axis of input signal PBSG which is a reproducing signal obtained from a magnetic tape is fluctuated accompanied with fluctuation of the traveling speed of a magnetic tape in a digital tape recorder, the lock of phase locked loop to reproduce a clock signal for reading signals from the reproducing signals may become unlocked. Actually, when the fluctuation becomes more than 2% to 3%, a phenomenon in which the lock is lost may occur.

In a digital phase locked loop system having such a composition as shown in FIG. 1, such a phenomenon in which lock is lost due to a cause of the fluctuation is explained with regard to FIG. 3.

Each waveform shown in FIG. 3(1) to FIG. 3(11) individually corresponds to each waveform in FIG. 2(1) to FIG. 2(11). A signal H outputted from the RS-type flip-flop 10 is shown in FIG. 3(11). While the signal H is a LOW level, the output K from the constant setting circuit 12 is always inputted into the frequency divider 7 as load signal G. In this case, for instance, N=8.

In FIG. 3, even though the phase difference between the UP timing (a1) of the input signal PBSG and the UP timing (b1) of the phase locked loop clock signal PLLCK is compensated at the timing (c1) of the load clock signal F (See FIG. 3(9)) from the logic circuit 9 as the frequency (or pulse width) of input signal PBSG becomes low (or long) after the UP timing (a1) show in FIG. 3(2), the ratio [8] of frequency division at the timing (d1) and (e1) thereafter is not coincident with the frequency (or pulse width) of the input signal PBSG. As a result, the difference may be accumulated at the UP timing (f1) of the phase locked loop clock signal PLLCK. Thereby such a problem in which the phase between the input signal PBSG and the phase locked loop clock signal PLLCK may greatly deviate occurs.

SUMMARY OF THE INVENTION

It is an object of the present invention to provide a digital phase locked loop system which can correspond to a wide range of fluctuation of the frequency of input signals with good characteristics and which can be effected with a simple composition.

The present invention presents a digital phase locked loop system comprising:

an oscillator for generating a clock signal of a predetermined frequency;

a frequency divider, in response to the clock signal from the oscillator, for producing a phase locked loop clock signal by dividing a frequency of the clock signal;

first means, in response to the input signal and the phase locked loop clock signal, for detecting a phase difference between the input signal and the phase locked loop clock signal to output a phase difference detecting signal;

second means, in response to the phase difference detecting signal, for setting the frequency divider at a frequency dividing ratio corresponding to the phase difference;

third means, in response to the input signal, for detecting a frequency of the input signal and for setting the frequency divider at a frequency dividing ratio at which the phase of the input signal is coincident with that of the phase locked loop clock signal; and fourth means, in response to an output from the first means, for changing the frequency dividing ratio to supply output from the second means to the frequency divider, and thereafter to supply output from the third means to the frequency divider.

According to the present invention, the third means comprises:

fourth means, in response to the input signal for detecting the frequency of the input signal on the basis of the clock signal; and means in response to output from the frequency detecting means, for changing the frequency dividing ratio used to set the frequency divider at which the phase of the input signal is coincident with that of the phase locked loop clock signal.

According to the present invention, the frequency detecting means comprises:

counter for computing the clock signal in the period from a leading edge to a trailing edge of the input signal; and sixth means, in response to output from the counter, for converting the computed figure from the counter to a minimum repeatable frequency of the input signal.

According to the frequency detecting means of the present invention, there are two counters for computing the clock signal and the reversed signals thereof respectively, and the converting means outputs the computed figure converted to a predetermined reference frequency of the input signal.

According to the present invention, the frequency dividing ratio changing means comprises Seventh means, in response to output from the frequency detecting means, for outputting one large frequency dividing ratio and one small frequency dividing ratio alternately once every predetermined number of times.

The frequency dividing ratio changing means of the invention comprises:

a read-only memory (ROM) which stores frequency ratios used to set the frequency divider; and a T-type flip-flop circuit, in response to output from the fourth means, for making toggle operations, and in response to output from the T-type flip-flop circuit, the read-only memory outputs the frequency dividing ratio stored in the storage area whose address is designated by output of the T-type flip-flop circuit and outputs of the frequency detecting means.

According to the present invention, the first means comprises;

a first D-type flip-flop circuit for latching the input signal with the phase locked loop clock signal;

a first AND gate for making the logical sum from the input signal, the output signal of the first D-type flip-flop circuit and the clock signal from the oscillator;

a second D-type flip-flop circuit for latching the output signal of the first D-type flip-flop circuit with the phase locked loop clock signal;

a second AND gate for making the logical sum from the output of the first D-type flip-flop circuit and the output of the second D-type flip-flop circuit; and a counter for computing on the basis of the output of the first AND gate and for resetting in response to the output of the second AND gate.

According to the present invention, a digital phase locked loop system sets a frequency dividing ratio corresponding to the phase difference between the input signal and the phase locked loop clock signal by means of the second means, thereby causing a frequency divider to be actuated. Such setting the frequency dividing ratio as described in the above can be effected, for instance, by computing the number of clock pulses from an oscillator in the period from the UP timing of input signal and the UP timing of phase locked loop clock signal.

The third means detects the fluctuation of frequency of the input signal by computing the number of clock pulses from the oscillator and determines the frequency dividing ratio on the basis of the frequency of the input signal. The fourth means actuates the frequency divider on the basis of the frequency dividing ratio set by the second means when the phase difference is detected and thereafter actuates the frequency divider with the frequency dividing ratio set by means of the third means.

Therefore, a digital phase locked loop system taught by the present invention can follow and correspond to a wide range of frequency fluctuation of the input signal only by a simple composition with good characteristics, thereby causing clock slip-off phenomenon to be prevented.

According to the present invention, a frequency dividing ratio corresponding to the phase difference between the input signal and the phase locked loop clock signal can be set by means of the second means and thereafter the frequency dividing ratio corresponding to the frequency of the input signal can be set by means of the third means, such that a phase locked loop system that even though the system is of a simple construction and the input signal fluctuates with a wide range, can lock the output frequency with good characteristics for an input signal of high frequency nearly equivalent to the limit of the processing speed of a logic circuit elements.

BRIEF DESCRIPTION OF THE DRAWINGS

These and other objects, features and advantages of the present invention will become more apparent from the ensuing detailed description when read in conjunction with the accompanying drawings wherein:

FIGS. 2(1–11) and 3(1–11) are timing charts showing waveforms of signals at each part in the prior art;

FIGS. 6(1-10) and 7(1-10) are timing charts showing the waveforms of signals of the counters; and FIGS. 8(1-10), 9(1-10), and 10(1-10) are timing charts showing the operations of the preferred embodiment of the present invention.

DESCRIPTION OF THE PREFERRED EMBODIMENT

The preferred embodiment of the present invention is described in details with reference to the drawings attached hereto.

Figure 4:
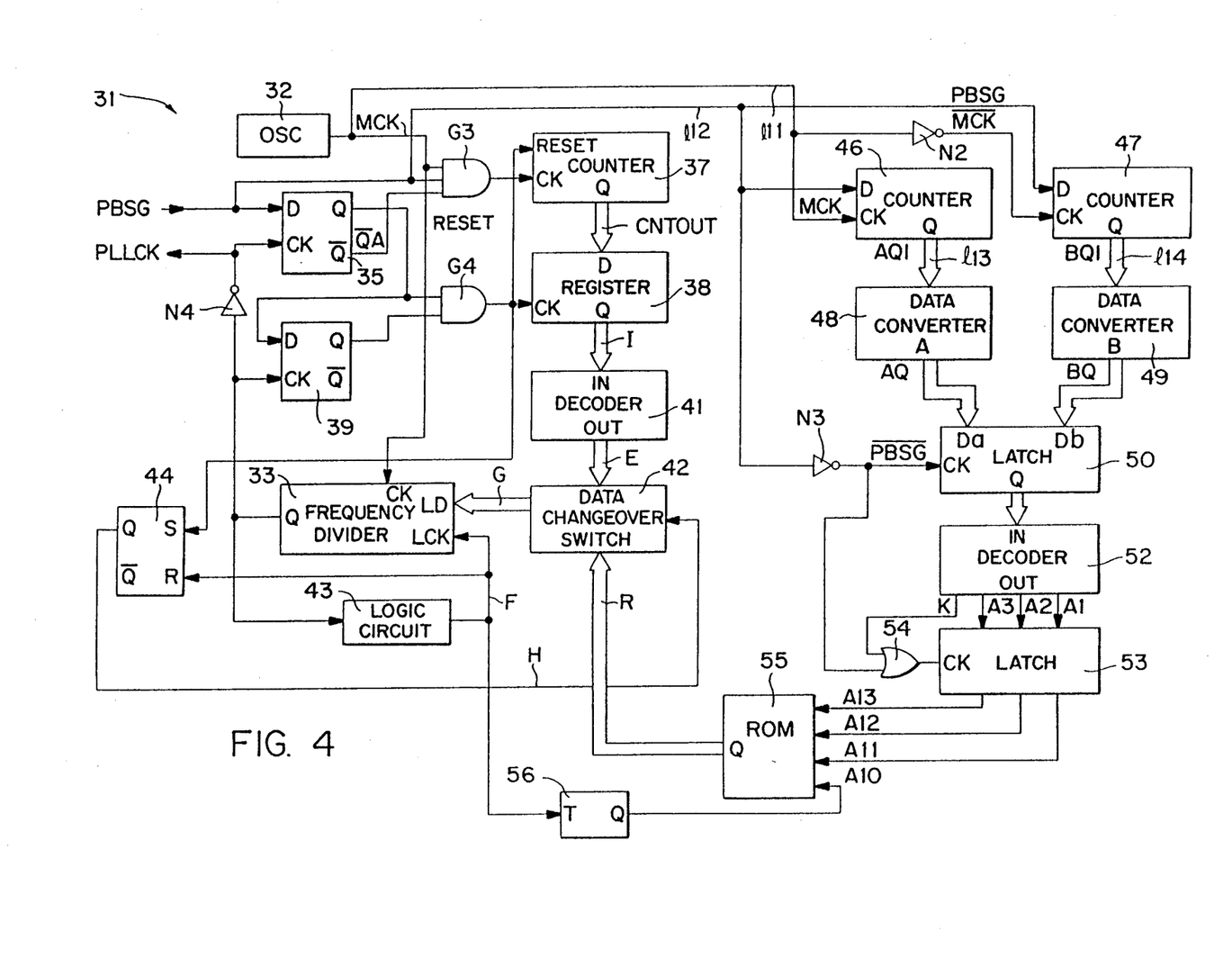
FIG. 4 is a block diagram showing an electrical construction of a digital phase locked loop system as one of the preferred embodiments of the present invention.
Figure 5:
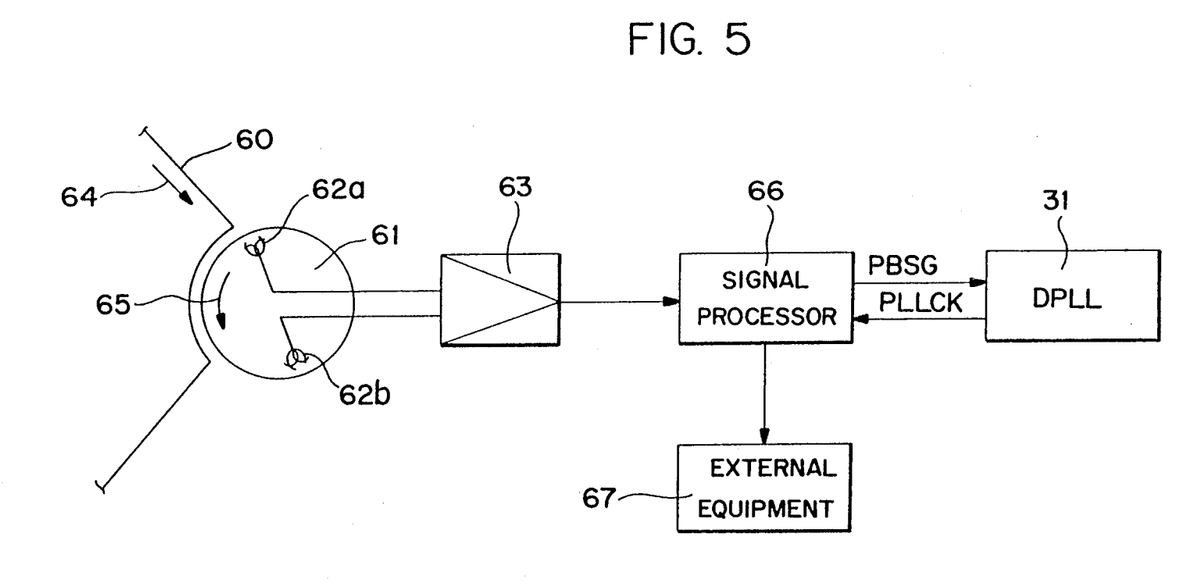
FIG. 5 is a simplified block diagram showing a magnetic tape reproducing apparatus in which a digital phase locked loop system is employed.
Figure 6:
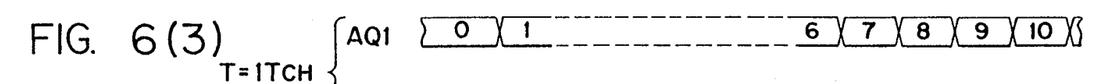
Figure 7:
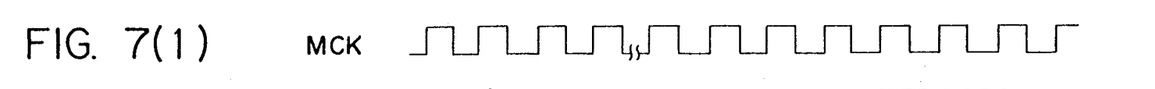

FIG. 4 is a block diagram showing an electrical construction of a digital phase locked loop system 31 which is one of the preferred embodiments of the present invention. The digital phase locked loop system 31 is preferably adopted in a magnetic tape reproducing apparatus of a rotary head system such as a DAT (digital audio tape recorder) as shown in FIG. 5. The preferred embodiment is characterized in that it is provided with two counters 46 and 47 and data converters 48 and 49 in order to detect the frequency components of input signal PBSG, for instance, concurrently using clock pulses MCK from an oscillator (OSC) 32. As a matter of course, an exclusive oscillator may be independently provided without use of clock pulse MCK. The input signal PBSG is inputted into the data input terminal D of the counters 46 and 47, respectively.

Clock pulse MCK is inputted into the clock input terminal CK at one counter 46 and is inputted into the clock input terminal CK through a reversing circuit N2 at the other counter 47. These counters 46 and 47 compute the number of clock pulses, which are inputted into the clock input terminal CK, in the period during which a signal having a HIGH level is being inputted into the data input terminal D.

FIG. 5 is a simplified block diagram showing a composition of a magnetic tape reproducing apparatus for reproducing a magnetic tape 60 on which audio signals and digital data converted to digital signals are recorded. Magnetic heads 62a and 62b are mounted in the opposite direction of each other by 180° at the side of a cylindrical rotary drum 61. The magnetic heads 62a and 62b are mounted with the gap therebetween provided with mutually different azimuth angles $+\alpha$ and $-\alpha$, in order to prevent noises due to cross talks. The magnetic tape 60 is wound on the side of the rotary drum 61 by such a degree as being equivalent to 90°.

As data is read out from the magnetic tape 60 on which data has been written, reproduced signals are inputted into an amplifier 63 from the magnetic heads 62a and 62b. Namely, differentiated output of magnetized patterns of the magnetic tape 60 is inputted into the amplifier 63 as reproduced signals from the magentic heads 62a and 62b by means of helical scanning system, by rotating the rotary drum 61, to which the magnetic tape 60 has been wound, in the direction of an arrow 65 for the magnetic tape 60 which is driven to travel in the direction of an arrow 64. Reproduced signals amplified to an adequate level in the amplifier 63 are inputted into a signal processor 66 through a waveform equalizer, a level slicer, etc. as digital reproduced signal with which judgement of [0] and [1] is made possible.

In the signal processor 66, such signal processings as correcting errors by parity of an error correcting symbol which has been given in advance of the recording data, de-interleaving to restored interleaves to rearrange the sequence of data. Thus, digital signals reproduced from the magnetic tape 60 is inputted into an external equipment 67 such as a computer.

A digital phase locked loop system (DPLL) 31, according to the present invention, is provided in the signal processor 66, in order to reproduce clock signals for reading signals from the digital signals to be reproduced.

When recording digital data on the magnetic tape 60, data to be recorded is modulated and recorded in accordance with a 8-10 modulation system, in which the reproduced signal does not have any DC component in the reproducing data, suited to not only overwriting but also lessening cross talk and the remains of deletion. In the 8-10 modulation system, all the usual modulation patterns include four different modulation patterns (Cycle T = $1T_{CH}$ through $4T_{CH}$) when the reference cycle is supposed to be $T_{CH}$. Therefore, as the produced signals PBSG digitalized by means of an amplifier 63 is inputted into the signal processor 66, the reproduced signals PBSG is inputted into the digital phase locked loop system 31 in the signal processor 66. In response thereto, the phase lock loop clock signal PLLCK locked to the input signal PBSG outputted from the digital phase locked loop system 31 is received as clock signals for reading the signals. In the signal processor 66, signal reading is carried out from the reproduced signal PBSG, utilizing the clock signal PLLCK locked to the reproduced signal PBSG.

Again back to FIG. 4, the waveform of clock pulse MCK from the oscillator 32 is shown in FIG. 6(1) and the waveform of input signal PBSG is shown in FIG. 6(2). The input signal PBSG is counted in the counter 46 at the UP timing of the clock pulse MCK and is counted at the DOWN timing in the counter 47. As the pulse width of the input signal PBSG is digitally modulated when using the reproduced signal PBSG, which is from such a magnetic tape 60 as shown in the above, as input signal, the input signal PBSG includes two times ($2T_{CH}$), three times ($3T_{CH}$), and four times ($4T_{CH}$) the reference cycle $T_{CH}$.

In the case when the cycle (or pulse width) T of the input signal PBSG is $1T_{CH}$, $2T_{CH}$, $3T_{CH}$, and $4T_{CH}$, the outputs of the counter 46 are supposed to be AQ1, AQ2, AQ3, and AQ4 and the outputs of the counter 47 are supposed to be BQ1, BQ2, BQ3, and BQ4. These outputs are shown in FIG. 6(3), FIG. 6(5), FIG. 6(7), and FIG. 6(9), and FIG. 6(4), FIG. 6(6), FIG. 6(8), and FIG. 6(10), respectively. The count output AQi (i = 1 to 4) of the counter 46 and the count output BQi (i = 1 to 4) are inputted through the lines 13 and 14, respectively, into the data converters 48 and 49 provided in correspondence to the counters 46 and 47.

As shown in Table 1, the data converters 48 and 49 convert the inputted count values so that these count values can be changed in the same range 6 to 10 (counts) as that of the counting value of the frequency in the cycle T = $1T_{CH}$ even though the cycle T may change from $1T_{CH}$ to $4T_{CH}$.

TABLE 1

| Counting value | | | | Converted |
|---|---|---|---|---|
| T = $1T_{CH}$ | T = $2T_{CH}$ | T = $3T_{CH}$ | T = $4T_{CH}$ | value |
| 5 | 13 | 21 | 29 | 6 |
| 6 | 14 | 22 | 30 | 6 |
| 7 | 15 | 23 | 31 | 7 |

TABLE 1-continued

| Counting value | | | | Converted |
|---|---|---|---|---|
| T = 1T$_{CH}$ | T = 2T$_{CH}$ | T = 3T$_{CH}$ | T = 4T$_{CH}$ | value |
| 8 | 16 | 24 | 32 | 8 |
| 9 | 17 | 25 | 33 | 9 |
| 10 | 18 | 26 | 34 | 10 |
| 11 | 19 | 27 | 35 | 10 |
| 12 | 20 | 28 | 36 | 10 |

(All other than the values described in the above table shall be regarded as six (6)).

The outputs AQ and BQ of the converted data from the data converters 48 and 49 are individually inputted into data terminals Da and Db of latch 50, and the input signal PBSG is inputted into the clock input terminal CK of the latch 50 after being reversed by reversing circuit N3. Therefore, the converted data is latched in the latch 50 at the DOWN timing of the input signal PBSG.

FIG. 7(1) through FIG. 7(10) shows the waveforms of signals respectively corresponding to FIG. 6(1) through FIG. 6(10). FIG. 7 shows that the phase for the clock pulse MCK of the input signal PBSG (Refer to FIG. 7(2)) slips off from that of the input signal PBSG shown in FIG. 6 (Refer to FIG. 6(2)).

The figures attached to the input signal PBSG shown in FIG. 6(2) and FIG. 7(2) indicate the number of clock pulses from the oscillator 32 while the input signal PBSG is being at a HIGH level. That is, the figures indicate the length of the input signal PBSG (pulse width).

Signals latched by the latch 50 are different by 0.5 steps from the number of clock pulses of the oscillator 32 in the period for which the input signal PBSG is at a HIGH level as shown in the next table 2, according to the length of period for which the input signal PBSG is at a HIGH level, and this result corresponds to the frequency of the input signal PBSG.

TABLE 2

| Cycle of PBSG | | 7 | | 7.5 | | 8 | | 8.5 | | 9 | to2T$_{CM}$ |
|---|---|---|---|---|---|---|---|---|---|---|---|
| Output of data converters 48 and 49 | AQ | 7 | 7 | 8 | 7 | 8 | 8 | 9 | 8 | 9 | 9 | — | — |
| | BQ | 7 | 7 | 7 | 8 | 8 | 8 | 8 | 9 | 9 | 9 | — | — |
| A1 | | 0 | | 1 | | 0 | | 1 | | 0 | — |
| A2 | | 0 | | 0 | | 1 | | 1 | | 0 | — |
| A3 | | 0 | | 0 | | 0 | | 0 | | 1 | — |
| K | | 0 | | 0 | | 0 | | 0 | | 0 | 1 |

The decoder 52 gives the total three bits of the outputs A1, A2, and A3 to the 53 in response to the output of the latch 50. Further, the decoder 52 gives the output K to the OR gate 54 in the cycle T=2T$_{CH}$ or in cycles other than the number of clock pulses 7 through 9. In addition, reversed input signal $\overline{PBSG}$ from the reversing circuit N3 is inputted into the OR gate 54. The output of the OR gate 54 is inputted into the clock input terminal CK of the latch 53.

When the output K of the decoder 52 is logic [0], that is, while the period of the input signal PBSG is d at a HIGH level as seen by FIGS. 7 and 9 of the clock pulses of the oscillator 32, the latch 53 can latch the output A1, A2, and A3 of the decoder 52 at the DOWN timing of the input signal PBSG. The output A11, A12, and A13 from the latch 53 corresponds to the output A1, A2, and A3 of the decoder 52, respectively and are inputted into the read-only memory (ROM) 55 which is means for changing the ratio of frequency division.

Hereupon, another signal A10 is outputted from the output terminal Q of T-type or toggle flip-flop (TFF) 56 and is inputted into the read-only memory 55. In the T-type flip-flop 56, load clock signal F from the logic circuit 43 is inputted into the input terminal T. Whenever the T-type flip-flop 56 receives the load clock signal F, it reverses the logical state of the output terminal Q. The read-only memory 55 receives the signal A10 through A13 as a address designation signal and causes the output R of four bits, which expresses the frequency dividing ratio stored in advance in the storage area designated by the address designation signals A10 to A13, outputted from the output terminal Q and inputted into the data changeover switch 42.

The details of storage of the read-only memory 55 is as shown in Table 3 below:

TABLE 3

Figure 2:
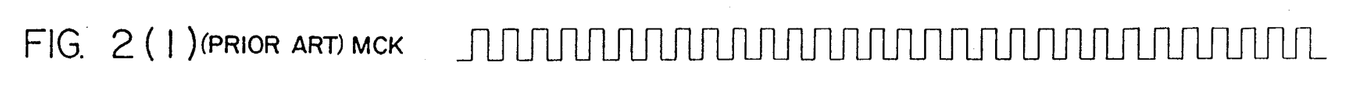
Figure 3:
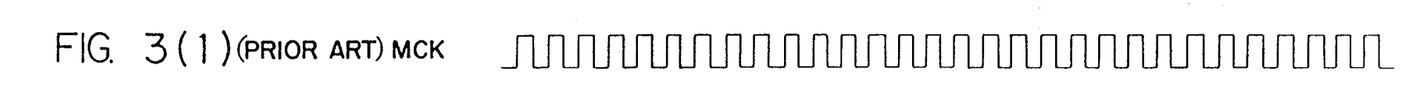
Figure 8:
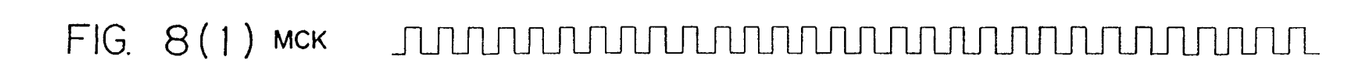
Figure 9:
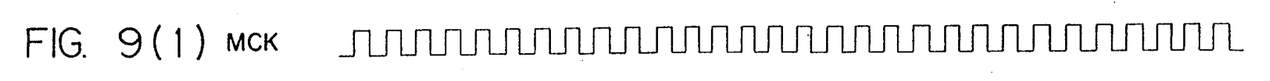
Figure 10:
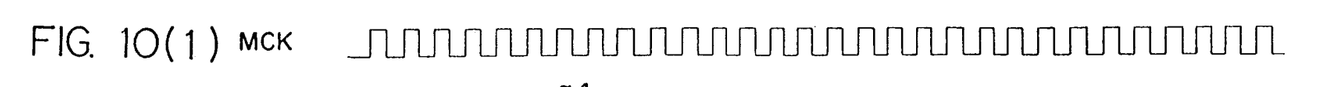

| Input of ROM 55 | | | | Output R | Cycle of | Drawing to be referred |
|---|---|---|---|---|---|---|
| A13 | A12 | A11 | A10 | of ROM 55 | PBSG | to |
| 0 | 0 | 0 | 0 | 9 | 7 | FIG. 8 |
| 0 | 0 | 0 | 1 | | | |
| 0 | 0 | 1 | 0 | 8 | 7.5 | FIG. 9 |
| 0 | 0 | 1 | 1 | 9 | | |
| 0 | 1 | 0 | 0 | 8 | 8 | (FIG. 2) |
| 0 | 1 | 0 | 1 | | | |
| 0 | 1 | 1 | 0 | 7 | 8.5 | FIG. 10 |
| 0 | 1 | 1 | 1 | 8 | | |
| 1 | 0 | 0 | 0 | 7 | 9 | — |
| 1 | 0 | 0 | 1 | | | |

The output R of the read-only memory 55 may change in response to the input (A10 to A13), and this state is shown in FIG. 8 to FIG. 10. Therefore, for instance, a programmable logic array (PLA) may be used instead of a read-only memory (ROM). FIG. 8 (1) shows a waveform of clock pulse MCK of the oscillator 32 FIG. 8 (2) shows a waveform of input signal PBSG. FIG. 8 (3) shows a waveform of phase locked loop clock signal PLLCK. The output signal $\overline{QA}$ from the output terminal $\overline{Q}$ of a D-type flip-flop 35 is shown in FIG. 8 (4), and the output CNTOUT of a counter 37 is shown in FIG. 8 (5).

Reset signal RESET from an AND gate G4 is shown in FIG. 8 (6), phase difference signal I of a register 38 is shown in FIG. 8 (7), the output E of decoder 41 is shown in FIG. 8 (8), load clock signal F of a logic circuit 43 is shown in FIG. 8 (9), and the signal H from the output terminal Q of a RS-type flip-flop 44 is shown in FIG. 8 (11). When the signal H is a HIGH level, the output E of the decoder 41 is loaded into the frequency divider 33 as load signal G. When it is a LOW level, the data changeover switch 42 is changed so that the output R of the read-only memory 55 can be loaded. The load signal G is shown in FIG. 8 (10).

FIG. 9 (1) through FIG. 9 (11) and FIG. 10 (1) through FIG. 10 (11) correspond to each waveform in FIG. 8 (1) through FIG. 8 (11), respectively. In FIG. 8 wherein the cycle of the input signal PBSG is seven times the clock pulse MCK of the oscillator 32, the output R of the read-only memory 55 becomes [9], and it is loaded into the frequency divider 33 as load signal G.

In FIG. 9 wherein the cycle of the input signal PBSG is seven point five times the clock pulse MCK, [8] and

[9] are outputted alternatively as output R of the read-only memory 55 whenever load clock signal F is outputted from the logic circuit 43, and they are loaded as load signal G.

In FIG. 10 wherein the cycle of the input signal PBSG is eight point five times the clock pulse MCK, [7] and [8] are outputted alternatively as output R of the read-only memory 55 and are loaded as load signal G.

As well, when the cycle of the input signal PBSG is eight or nine times the clock pulse MCK, the output R of the read-only memory 55 becomes [8] or [7] and these figures are loaded as load signal G in the frequency divider 33, respectively.

Thus, as in FIG. 8 to FIG. 10 phase difference between the UP timing of the input signal PBSG and the UP timing of the phase locked loop clock signal PLLCK, i.e., a2 and b2, a3 and b3, and a4 and b4 is compensated by changing the frequency dividing ratio of load signal G at the DOWN timing c2, d2, e2, c3, d3, e3, and c4, d4, e4 of the load clock signal F of the logic circuit 43, no phase difference occurs at the timing f2, f3 and f4. Thus, even though the cycle of the input signal PBSG is changed in the range from seven times to nine times the cycle of the clock pulse MCK from the oscillator 32, the locking range of phase locked loop for the fluctuation in the frequency of the input signal PBSG in this range can be remarkably improved, thereby causing the lock to unlock to be prevented.

In the above preferred embodiment, the description is dealt with, on the basis of the case that a digital phase locked loop system 31 has been adopted in a magnetic tape reproducing apparatus. However, the embodiment is not limited to this case. A digital phase locked loop system disclosed by the invention can be widely utilized in, for instance, a compact disk (CD) reproducing apparatus or other similar apparatuses.

Also, in the above preferred embodiment, the frequency detecting accuracy of the input signal PBSG is raised up to ½ of the clock pulse MCK of the oscillator 32 and its degree of accuracy has been increased by using two counters 46 and 47. However, even though such a composition as using a single counter is utilized, the frequency detecting accuracy of the input signal PBSG can be increased to ½ of the clock pulse MCK in principle. Furthermore, it is possible to further improve the frequency detecting accuracy of the input signal PBSG and the precision degree thereof by increasing the number of counters. Still furthermore, shift resisters may be used instead of counters.

Also in the above preferred embodiment, the outputs R [8] and [9] or [7] and [8] of the read-only memory 55 are outputted alternatively in order that the frequency of the input signal PBSG is caused to be seven point five or eight point five times the clock pulse MCK of the oscillator 32. However, in another modification of the embodiment, it is further possible to lock the phases with individual control, corresponding to the cycle of the input signal PBSG, by setting the duty ratio of the output of a different signal R to a value other than 50% of outputting the different signal R alternatively once every number of times determined in advance.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A digital phase locked loop system for receiving an input signal and supplying a phase locked loop clock signal for synchronizing the input signal comprising:

an oscillator for generating a clock signal of a predetermined frequency;

a variable frequency divider, responsive to said clock signal from said oscillator, for producing a phase locked loop clock signal by dividing a frequency of said clock signal;

first means, responsive to the input signal and the phase locked loop clock signal, for detecting a phase difference between the input signal and the phase locked loop clock signal, thereby outputting a phase difference detecting signal according to the detected difference;

second means, operatively connected to said first means and responsive to said phase difference detecting signal, for providing said frequency divider with a first frequency dividing ratio corresponding to said phase difference when said phase difference detecting signal is received;

third means, operatively connected to said oscillator and responsive to the input signal and said phase locked loop clock signal, for detecting a frequency of the input signal and for providing said variable frequency divider with a second frequency dividing ratio corresponding to a phase of the input signal being coincidence with a phase of the phase locked loop clock signal; and fourth means, operatively connected to said frequency divider and said third means, for initially establishing said first frequency dividing ratio of said variable frequency divider according to said second means and thereafter establishing said second frequency dividing ratio of said variable frequency divider according to said third means in response to said phase locked loop clock signal produced by said variable frequency divider in response to said first frequency dividing ratio.

2. The digital phase locked loop system as claimed in claim 1, wherein said third means comprises:

frequency detecting means, operatively connected to said oscillator and responsive to the input signal, for detecting a frequency of the input signal on the basis of said clock signal; and fifth means, operatively connected to said frequency detecting means, for providing said second frequency dividing ratio of said variable frequency divider so that said phase of the input signal will be coincidence with said phase of the phase locked loop clock signal.

3. The digital phase locked loop system as claimed in claim 2, wherein said frequency detecting means comprises:

a first counter, operatively connected to said oscillator, for counting to a first value from said clock signal during a period from a leading edge to a trailing edge of the input signal; and converting means, operatively connected to said first counter, for converting said first value from said first counter to a minimum repeatable frequency of the input signal.

4. The digital phase locked loop system as claimed in claim 3, wherein said frequency detecting means further comprises:

a second counter, operatively connected to said oscillator, for counting to a second value from an inverse of said clock signal during a period from a leading edge to a trailing edge of the input signal;

said converting means, operatively connected to said second counter, converting said second value to a predetermined reference frequency of the input signal.

5. The digital phase locked loop system as claimed in claim 2, wherein said fifth means comprises:

sixth means, operatively connected to said frequency detecting means, for alternatively outputting a large frequency dividing ratio (N) and a small frequency dividing ratio (N−1), wherein a time period between actual changes in the output is predetermined.

6. The digital phase locked loop system as claimed in claim 2, wherein said fifth means comprises:

a read-only memory which stores frequency dividing ratios to be used by said variable frequency divider; and a T-type flip-flop circuit, responsive to said phase locked loop clock signal, for providing toggle operations;

said read-only memory, operatively connected to said T-type flip-flop circuit, outputting said second frequency dividing ratio stored therein having an address designated by outputs from said T-type flip-flop circuit and said frequency detecting means.

7. The digital phase locked loop system as claimed in claim 1, wherein said first means comprises:

a first D-type flip-flop circuit for latching the input signal with the phase locked loop clock signal;

a first AND gate for producing a logical sum from the input signal, an output signal of said first D-type flip-flop circuit, and said clock signal from said oscillator;

a second D-type flip-flop circuit for latching said output signal of said first D-type flip-flop circuit with the phase locked loop clock signal;

a second AND gate for producing a logical sum from said output of said first D-type flip-flop circuit and an output of said second D-type flip-flop circuit; and a counter for counting to a value based on an output of said first AND gate and resetting said value in response to an output of said second AND gate.

* * * * *